(12) United States Patent
Nakamura

(10) Patent No.: US 6,538,322 B2
(45) Date of Patent: Mar. 25, 2003

(54) SEMICONDUCTOR DEVICE IN A RECESS OF A SEMICONDUCTOR PLATE

(75) Inventor: Akio Nakamura, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/006,142

(22) Filed: Dec. 10, 2001

(65) Prior Publication Data

US 2002/0043720 A1 Apr. 18, 2002

Related U.S. Application Data

(62) Division of application No. 09/221,149, filed on Dec. 28, 1998, now Pat. No. 6,340,842.

(30) Foreign Application Priority Data

Apr. 2, 1998 (JP) .............................................. 10-90137

(51) Int. Cl.[7] .............................................. H01L 23/34
(52) U.S. Cl. ...................... 257/723; 257/738; 257/724; 257/711; 257/778; 257/779; 257/780; 257/784; 257/787
(58) Field of Search ................................. 257/724, 678, 257/738, 787, 778, 706, 707, 712, 711, 717, 675, 777, 688, 692, 737, 723, 779, 780, 784

(56) References Cited

U.S. PATENT DOCUMENTS

| | | | | |
|---|---|---|---|---|
| 3,715,245 A | * | 2/1973 | Barnett et al. ............... 148/171 |
| 4,670,770 A | * | 6/1987 | Tai ............................. 257/777 |
| 5,049,978 A | * | 9/1991 | Bates et al. .................. 257/686 |
| 5,184,211 A | * | 2/1993 | Fox ............................. 257/706 |
| 5,578,869 A | * | 11/1996 | Hoffman et al. ............. 257/691 |
| 5,596,231 A | * | 1/1997 | Combs ........................ 257/776 |
| 5,629,835 A | * | 5/1997 | Mahulikar et al. ........... 361/719 |
| 5,675,684 A | * | 10/1997 | Hirataka et al. ............... 385/88 |
| 5,710,695 A | * | 1/1998 | Manteghi ..................... 361/813 |
| 5,814,883 A | * | 9/1998 | Sawai et al. ................. 257/675 |
| 5,869,889 A | * | 2/1999 | Chia et al. ................... 257/701 |
| 5,907,151 A | * | 5/1999 | Gramann et al. ........... 250/214.1 |
| 5,910,686 A | * | 6/1999 | Hamezehdoost et al. .... 257/778 |
| 5,986,334 A | * | 11/1999 | Lee .............................. 257/667 |
| 5,990,552 A | * | 11/1999 | Xie et al. ..................... 257/718 |
| 6,268,648 B1 | * | 7/2001 | Fukutomi et al. ........... 257/678 |

FOREIGN PATENT DOCUMENTS

| | | | |
|---|---|---|---|
| JP | 3-163861 | * | 7/1991 |
| JP | 3-177055 | * | 8/1991 |
| JP | 4-340750 | * | 11/1992 |
| JP | 6-244304 | * | 9/1994 |

\* cited by examiner

Primary Examiner—Albert W. Paladini
Assistant Examiner—Luan Thai
(74) Attorney, Agent, or Firm—Rabin & Berdo, PC

(57) ABSTRACT

A semiconductor device provided with one or more semiconductor pellets arranged on the bottom surface of a recess produced along a surface of a semiconductor plate having wirings arranged on the surface thereof, wirings extending toward the surface of the recess, and the recess being buried with a layer of a resin which is inclined to inflate, while it is hardened, resultantly producing a stress in the resin layer to expand toward the side wall of the recess engraved in the semiconductor plate, resultantly preventing breakage from happening for an interface between the side wall of the recess engraved in the semiconductor plate and the surface of the resin layer contacting the side wall, and remarkably improving the thermal conductivity efficiency to reduce the magnitude of a temperature rise of the semiconductor device, resultantly preventing a delay from happening for the operation speed of the semiconductor device.

10 Claims, 11 Drawing Sheets

SEMICONDUCTOR DEVICE IN A RECESS OF A SEMICONDUCTOR PLATE

This application is a Divisional Application of prior application Ser. No. 09/221,149, filed on Dec. 28, 1998 now U.S. Pat. No. 6,340,842.

FIELD OF THE INVENTION

This invention relates to an improvement applicable to the structure of a semiconductor device which includes one or more semiconductor pellets having at least one semiconductor device element disposed therein and being mounted on a printed circuit board and being covered by a resin layer and to a method for producing a semiconductor device free from drawbacks accompanying the structure of a semiconductor device which includes one or more semiconductor pellets having at least one semiconductor device element disposed therein and mounted on a printed circuit board and being covered by a resin layer.

BACKGROUND OF THE INVENTION

Available in the prior art is a semiconductor device illustrated in FIG. 1. Referring to the drawing, a semiconductor pellet 22 in which at least one semiconductor device element has been produced, is mounted on a printed circuit board 11 made of a glass epoxy resin complex et al. and which has bonding pads 20 thereon connected by bonding wires 26 with the counter parts 24 produced on the semiconductor pellets 22, which are covered by a resin layer 28. The printed circuit board 11 has solder bump electrodes 16 produced thereunder. When such a semiconductor device is mounted on a larger printed circuit board or a mother board 14, as is shown in FIG. 2, the solder bump electrodes 16 are connected, employing a melting process, with corresponding electrodes 50 printed on the larger printed circuit board or the mother board 14.

The foregoing semiconductor device available in the prior art is inevitably accompanied by drawbacks tabulated below.
1. The adhesion is inclined to be broken for the interface between the semiconductor pellets 22 and the resin layer 28, due to thermal stress caused by the difference in the coefficients of thermal expansion. This drawback readily happens during the process for mounting the semiconductor device on the larger printed circuit board or the mother board. This drawback readily allows humidity to contact metal parts of the circuit of the semiconductor pellets 22, resultantly causing the metal parts of the circuit to be corroded.
2. The heat generated in the semiconductor pellets 22 is dissipated toward the larger printed circuit board or the mother board through the printed circuit board 11 made of the glass epoxy resin complex et al. of which the thermal conductivity is less, resultantly causing a less grade of the thermal dissipation efficiency for the semiconductor device having the foregoing structure. This drawback readily causes a remarkable rate of delay in the operation speed of the semiconductor device.

OBJECT AND SUMMERY OF THE INVENTION

Accordingly, an object of this invention is to provide a variety of semiconductor devices for which the hermetic seal is reliable for the interface between one or more semiconductor pellets having one or more semiconductor device element disposed therein and being arranged therein and a resin layer which covers the semiconductor pellet or pellets, resultantly effectively preventing humidity from contacting the metal parts of the circuits of the semiconductor device and sufficiently protecting the metal parts of the circuits from potential corrosion and for which the thermal conductivity has been improved, resultantly preventing a delay in operation speed from occurring due to a temperature rise thereof.

The other object of this invention is to provide a method for producing the variety of semiconductor devices having the foregoing advantages.

To achieve the foregoing object, the semiconductor device in accordance with this invention is based on a concept that one or more semiconductor pellets having one or more semiconductor device element disposed therein are arranged on the bottom surface of a recess produced along a surface of a semiconductor plate having wirings arranged on the surface of the semiconductor plate, the wirings extending toward the surface of the recess, and the recess being buried with a layer of a resin which is inclined to inflate, while it is hardened, resultantly producing a mechanical stress in the resin layer in a direction to expand the resin layer toward the side wall of the recess engraved in the semiconductor plate, resultantly preventing breakage from happening for an interface between the side wall of the recess engraved in the semiconductor plate and the surface of the resin layer contacting the side wall, and remarkably improving the thermal conductivity efficiency to reduce the magnitude of a temperature rise of the semiconductor device, resultantly preventing a delay from happening for the operation speed of the semiconductor device.

Various embodiments itemized below are presented.
1. The connection between the bonding pads of the semiconductor pellet or pellets and the wirings can be made by bump electrodes.
2. The recess of the semiconductor plate can be made to have a multiple step.
3. The rear surface of the semiconductor plate can be provided with plural cooling grooves arranged in parallel to each other, arranged in plural crosses or arranged in some other geometrical patterns.
4. The rear surface of the semiconductor plate can be provided with a metal plate heat sink.

To achieve the foregoing other object of this invention, the method for producing the variety of semiconductor devices of this invention has a step for producing a recess along one surface of a semiconductor plate, a step for producing wirings extending along a surface of the recess of the semiconductor plate and along one surface of the semiconductor plate, either two steps consisting of a step for placing at least one semiconductor pellet having at least one semiconductor device element disposed therein and having bonding pads arranged thereon and a step for connecting the bonding pads with the wirings employing bonding wires, or one step for placing at least one semiconductor pellet having at least one semiconductor device element disposed therein and having bonding pads arranged thereon, in a face down position to connect the bonding pads with the wirings, a step for burying the recess with a resin, and a step for producing plural electrodes along the one surface of the semiconductor plate to connect the electrodes with the wirings.

BRIEF DESCRIPTION OF THE DRAWINGS

This invention, together with its various features and advantages, can be readily understood from the following more detailed description presented in conjunction with the following drawings, in which.

DETAILED DESCRIPTION OF THE PREFERRED EMBODIMENTS

Referring to drawings, semiconductor devices in accordance with ten independent embodiments of this invention will be described below.

First Embodiment

Figure 1:
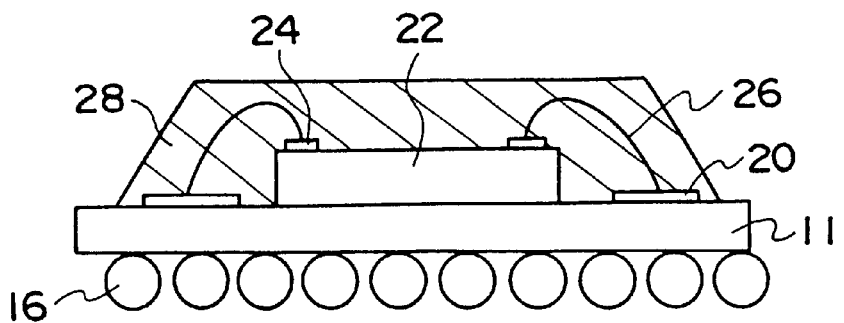
FIG. 1 is a cross section of a semiconductor device available in the prior art.
Figure 2:
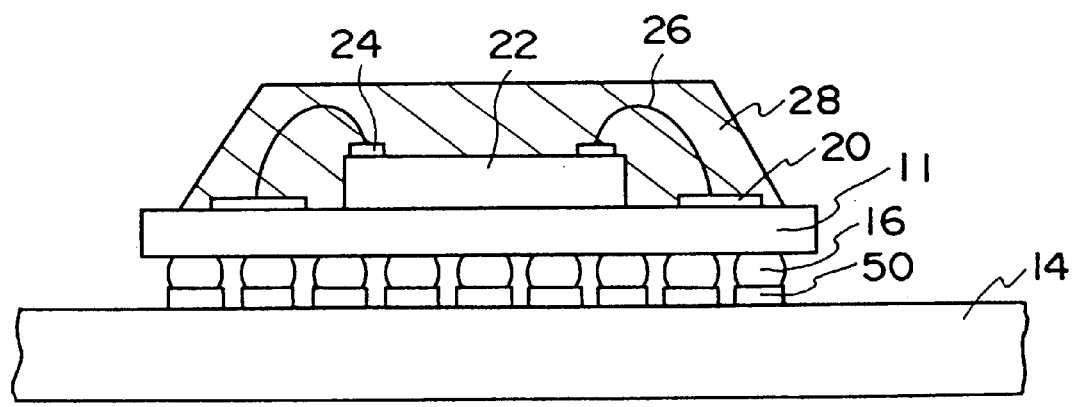
FIG. 2 is a cross section of a semiconductor device available in the prior art, the semiconductor device being mounted on a mother board.
Figure 3:
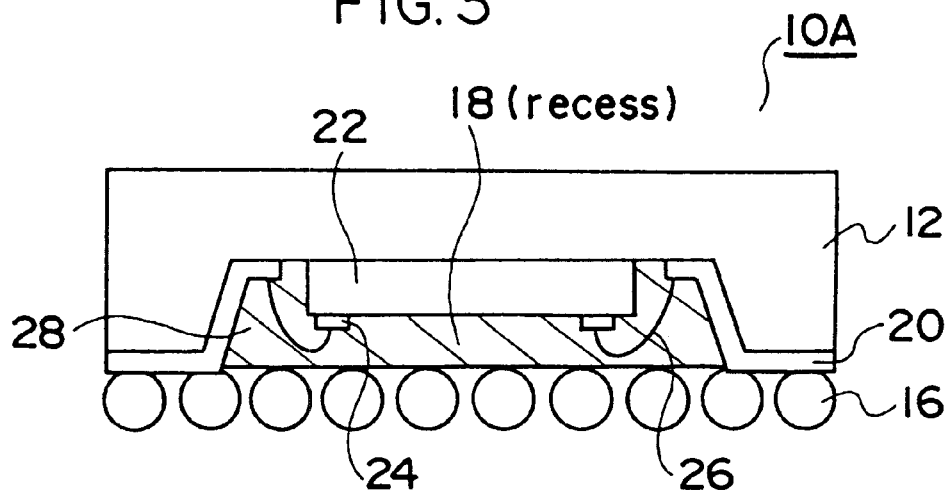
FIG. 3 is a cross section of a semiconductor device in accordance with the first embodiment of this invention.

Referring to FIG. 3, a chemical etching process or a laser etching process is conducted to produce a recess 18 along one surface of a square or rectangular plate 12 made of a material e.g. a semiconductor such as Si having a coefficient of thermal expansion identical or similar to that of the material of a semiconductor pellet referred to later. After an Al layer is produced to cover the surface of the recess 18 and the surface of the Si plate 12 surrounding the recess 18, an etching process is conducted to remain patterned Al wirings 20 extending in a radial direction.

A pellet 22 of a semiconductor e.g. Si in which at least one semiconductor device element has been produced and on which bonding pads 24 have been produced along the periphery thereof, is adhered along the surface of the recess 18 in a position in which the bonding pads 24 do not face the surface of the recess 18. A wire bonding process is conducted to connect each of the bonding pads 24 of the Si pellet 22 with corresponding one of the wirings 20 produced on the Si plate 12, employing bonding wires 26.

The recess 18 is buried with a resin having characteristics to increase the volume thereof during a hardening process. The object of the resin layer 28 is to protect and passivate the semiconductor pellet 22. The surface of the resin layer 28 is made flush with the surface of the Si plate 12.

Plural electrodes 16 in the form of solder bumps are produced to be connected with the wirings 20 in a position to surround the resin layer 28.

In the foregoing manner, a semiconductor device 10A in accordance with the first embodiment of this invention has been produced.

Figure 4:
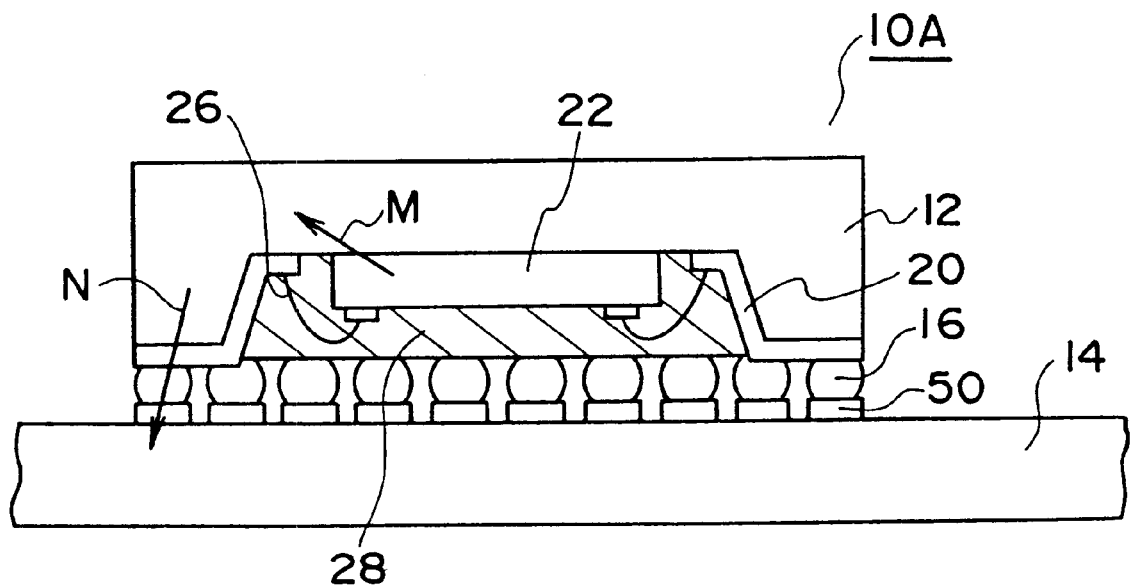
FIG. 4 is a cross section of a semiconductor device in accordance with the first embodiment of this invention, the semiconductor device being mounted on a mother board.

Referring to FIG. 4, the semiconductor device 10A in accordance with the first embodiment of this invention is mounted on a larger printed circuit board or a mother board 14. When being mounted, the semiconductor device 10A is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10A in accordance with the first embodiment of this invention are itemized below.

1. Since the material of the square or rectangular plate 12 is identical or similar to that of the semiconductor pellet 22, a thermal stress can hardly occur between the plate 12 and the semiconductor pellet 22 during the period in which the semiconductor device 10A is mounted on the larger printed circuit board or the mother board 14, resultantly reducing possibility in which the interface between the plate 12 and the resin layer 28 breaks.
2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is put into practical operation.
3. Since the heat generated in the semiconductor device under practical services is dissipated into the larger printed circuit board or the mother board 14, passing through the plate 12 and the solder bumps 16 and the electrodes 50, as shown by arrows M and N respectively, a better grade can be realized for the heat dissipation efficiency.
4. The foregoing advantages, in combination, remarkably improves the reliability of the semiconductor device 10A in accordance with the first embodiment of this invention, because there are less possibilities in which humidity contacts the metal parts arranged on the semiconductor pellet 22 to cause corrosion and in which overheating of the semiconductor device is readily prevented from occurring to resultantly secure an improved operation speed of the semiconductor device.

Second Embodiment

Figure 5:
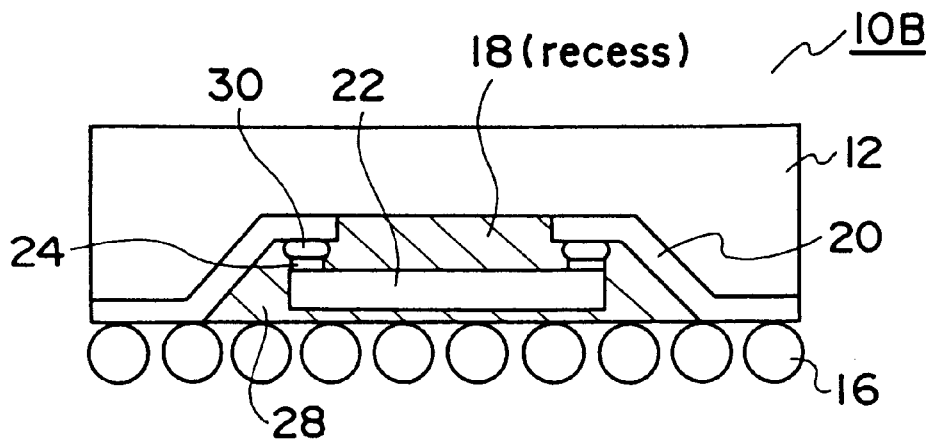
FIG. 5 is a cross section of a semiconductor device in accordance with the second embodiment of this invention.

Referring to FIG. 5, a chemical etching process or a laser etching process is conducted to produce a recess 18 along one surface of a square or rectangular plate 12 made of e.g. Si. After an Al layer is produced to cover the surface of the recess 18 and the surface of the Si plate 12 surrounding the recess 18, an etching process is conducted to remain patterned Al wirings 20 extending in a radial direction.

A pellet 22 made of a semiconductor e.g. Si in which at least one semiconductor device element has been produced and on which bonding pads 24 have been produced along the periphery thereof, is adhered along the surface of the recess 18 in a position in which the bonding pads 24 face the surface of the recess 18. Solder bump electrodes 30 are employed to connect each of the bonding pads 24 with corresponding one of the wirings 26.

The recess 18 is buried with a resin. The object of the resin layer 28 is to protect and passivate the semiconductor pellet 22. The surface of the resin layer 28 is made flush with the surface of the Si plate 12.

Plural electrodes 16 in the form of solder bumps are produced to be connected with the wirings 20 in a position to surround the resin layer 28.

In the foregoing manner, a semiconductor device 10B in accordance with the second embodiment of this invention has been produced.

Figure 6:
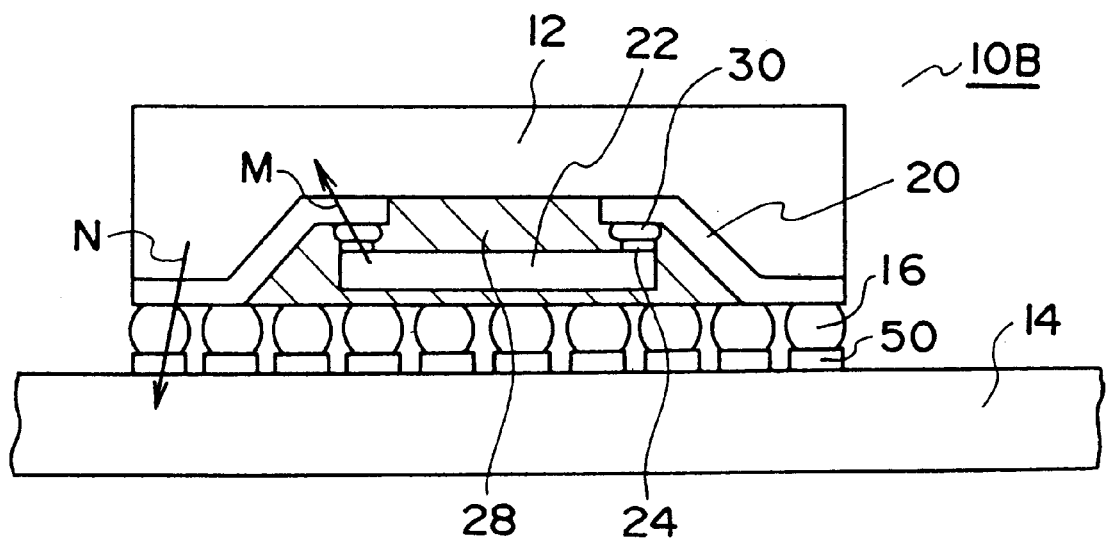
FIG. 6 is a cross section of a semiconductor device in accordance with the second embodiment of this invention, the semiconductor device being mounted on a mother board.

Referring to FIG. 6, the semiconductor device 10B in accordance with the second embodiment of this invention is mounted on a larger printed circuit board or a mother board 14. When being mounted, the semiconductor device 10B is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10B in accordance with the second embodiment of this invention are itemized below.

1. Since the material of the square or rectangular plate 12 is identical or similar to that of the semiconductor pellet 22, a thermal stress can hardly occur between the plate 12 and the semiconductor pellet 22 during the period in which the semiconductor device 10B is mounted on a larger printed circuit board or a mother board 14, resultantly reducing possibility in which the interface between the plate 12 and the resin layer 28 breaks.

2. Since the resin layer 28 is a bulk of a resin which was hardened and inflated in the recess 18, the resin layer 28 is under a chemical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is put into practical operation.

3. Since the heat generated in the semiconductor device under practical services is dissipated into the larger printed circuit board or a mother board 14, passing through the plate 12 and the solder bumps 16 and the electrodes 50, as shown by arrows M and N respectively, a better grade can be realized for the heat dissipation efficiency.

4. Since the semiconductor pellet 22 is mounted on the surface of the recess 18 in a face down position, and since the bonding pads 24 of the semiconductor pellet 22 are connected with the wirings 20 arranged along the surface of the recess 18 by solder bumps 30, a less length of time is required for producing the semiconductor device 10B and a better grade of the heat dissipation efficiency is realized for the semiconductor device 10B.

5. The foregoing advantages, in combination, remarkably improves the reliability of the semiconductor device 10B in accordance with the second embodiment of this invention, because there are less possibilities in which humidity contacts the metal parts of the semiconductor pellet 22 to cause corrosion and in which overheating of the semiconductor device is readily prevented from occurring to resultantly secure an improved operation speed for the semiconductor device. In addition, it is noted that the length of time required for producing the semiconductor device is less.

Third Embodiment

Figure 7:
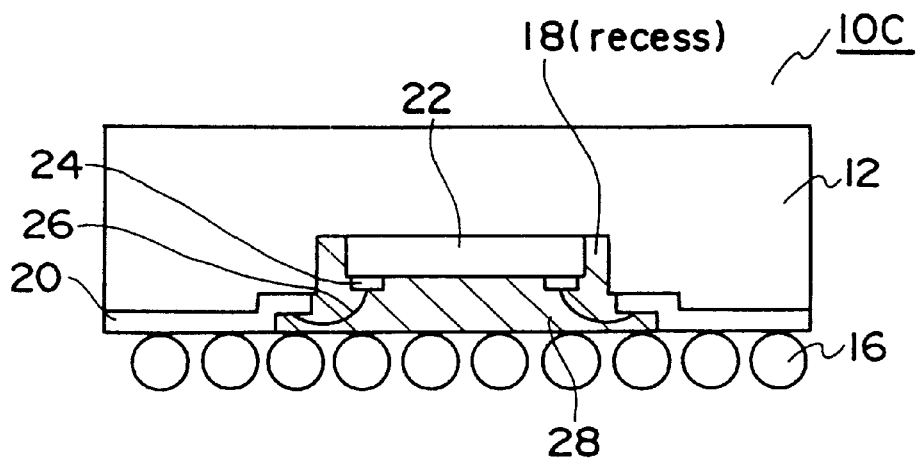
FIG. 7 is a cross section of a semiconductor device in accordance with the third embodiment of this invention.

Referring to FIG. 7, a chemical etching process or a laser etching process is conducted to produce a multi-stepped recess 18 (In the drawings, a two stepped recess.) having a deeper recess having a smaller horizontal dimension and being surrounded by a shallower recess having a larger horizontal dimension along one surface of a square or rectangular plate 12 of e.g. Si. After an Al layer is produced to cover the surface of the step and the surface of the Si plate 12 surrounding the step, an etching process is conducted to remain patterned Al wirings 20 extending in a radial direction and having one end terminated at the edge of the shallower recess, as is illustrated in FIG. 7. In this example, the height of the first step or the depth of the shallower recess is supposed to vary between 30 μm and 100 μm, and the height of the second step or the depth of the deeper recess is supposed to vary between 250 μm and 580 μm. The thickness of a semiconductor pellet 22 to be referred to below is supposed to vary 200 μm and 300 μm.

A pellet 22 made of a semiconductor e.g. Si in which at least one semiconductor device element has been produced and on which bonding pads 24 have been produced along the periphery thereof, is adhered along the surface of the recess 18 in a position in which the bonding pads 24 do not face the surface of the recess 18. A wire bonding process is conducted to connect each of the bonding pads 24 with corresponding one of the wirings 20, employing bonding wires 26.

The recess 18 is buried with a resin. The object of the resin layer 28 is to protect and passivate the semiconductor pellet 22.

Plural electrodes 16 in the form of solder bumps are produced to be connected with the wirings 20 in a position to surround the resin layer 28.

In the forgoing manner, a semiconductor device 10C in accordance with the third embodiment of this invention has been produced.

Figure 8:
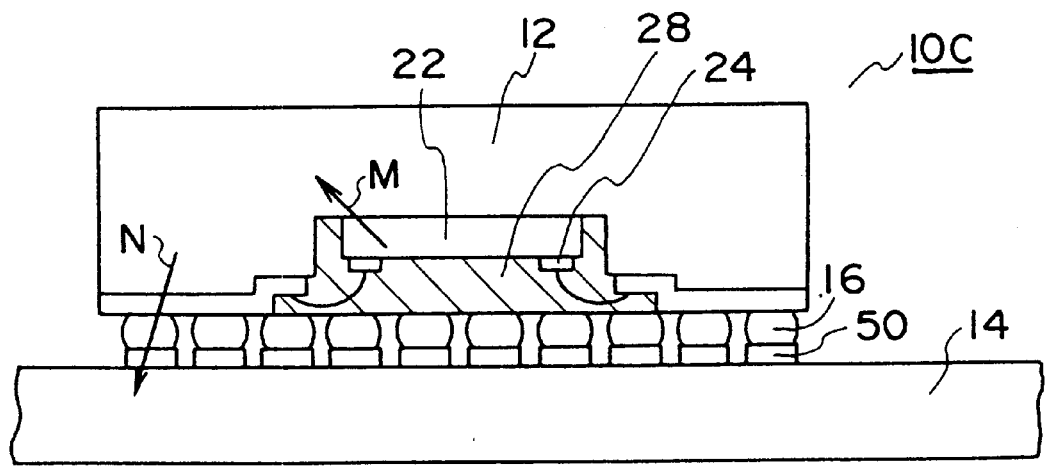
FIG. 8 is a cross section of a semiconductor device in accordance with the third embodiment of this invention, the semiconductor device being mounted on a mother board.

Referring to FIG. 8, the semiconductor device 10C in accordance with the third embodiment of this invention is mounted on a larger printed circuit board or a mother board 14. When being mounted, the semiconductor device 10C is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10C in accordance with the third embodiment of this invention are itemized below.

1. Since the material of the square or rectangular plate 12 is identical or similar to that of the semiconductor pellet 22, a thermal stress can hardly occur between the plate 12 and the semiconductor pellet 22 during the period in which the semiconductor device 10C is mounted on a larger printed circuit board or a mother board 14, resultantly reducing possibility in which the interface between the plate 12 and the resin layer 28 breaks.
2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is put into practical operation.
3. Since the heat generated in the semiconductor device under practical services is dissipated into the larger printed circuit board or a mother board 14, passing through the plate 12 and the solder bumps 16 and the electrodes 50, as shown by arrows M and N respectively, a better grade can be realized for the heat dissipation efficiency.
4. Since the recess 18 of the Si plate 12 is a multi-stepped one having a shallow shoulder in addition to a deep bottom, additional advantages are recognized, as follows.
A. The process for producing the wirings 20 becomes easier, because the height of the step is less. There is a less possibility in which the wirings 20 are discontinued at an edge of the step.
B. The possibility in which a bonding wire 26 contacts with the edge of the semiconductor pellet 22 becomes less, because the level of the bonding pad 24 is nearly identical to that of the wiring 20 on the step.
5. The foregoing advantages, in combination, remarkably improves the reliability of the semiconductor device 10C in accordance with the third embodiment of this invention, because there are less possibilities in which the wirings 20 discontinue and/or the bonding wires are short-circuited with the edge of the semiconductor pellet 22, in addition to a less magnitude of the possibility in which humidity contacts the metal parts of the semiconductor pellet 22 to cause corrosion and in which overheating of the semiconductor device is readily prevented from occurring to resultantly secure an improved operation speed for the semiconductor device.

It is needless to emphasize that the number of steps to be produced for the recess 18 is not limited to one. It can be two or three.

Fourth Embodiment

Figure 9:
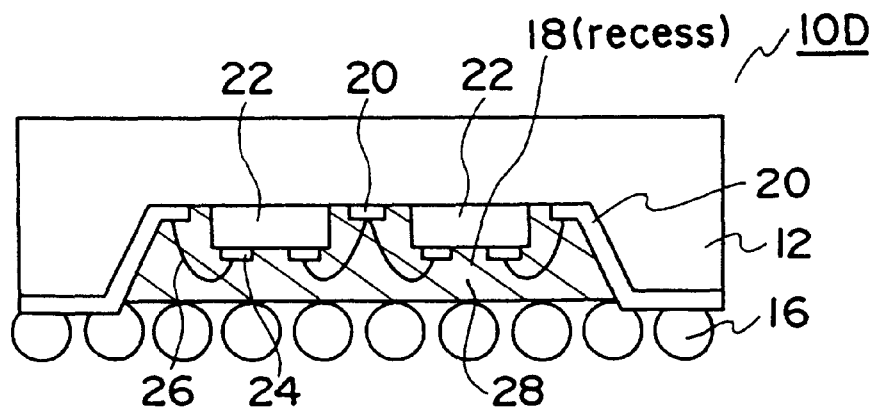
FIG. 9 is a cross section of a semiconductor device in accordance with the fourth embodiment of this invention.

Referring to FIG. 9, a chemical etching process or a laser etching process is conducted to produce a recess 18 along one surface of a square or rectangular plate 12 of e.g. Si. After an Al layer is produced to cover the surface of the recess 18 and the surface of the Si plate 12 surrounding the recess 18, an etching process is conducted to remain patterned Al wirings 20 extending to the neighborhood of bonding pads 24 of Si pellets 22 which are scheduled to be arranged in the recess 18.

Two or more pellets 22 made of a semiconductor e.g. Si in each of which pellets at least one semiconductor device element has been produced and on each of which bonding pads 24 have been produced along the periphery thereof, are adhered along the surface of the recess 18 in a position in which the bonding pads do not face the surface of the recess 18. The horizontal arrangement of the Si pellets 22 in the recess 18 is entirely free. A wire bonding process is conducted to connect each of the bonding pads 24 with corresponding one of the wirings 20, employing bonding wires 26. The horizontal shape of the Al wirings 20 is selected to be compatible with the horizontal arrangement of the Si pellets 22 in the recess 18, in a manner to make the length of the bonding wires 26 minimum.

The recess 18 is buried with a resin. The object of the resin layer 28 is to protect and passivate the semiconductor pellet 22. The surface of the resin layer 28 is made flush with the surface of the Si plate 12.

Plural electrodes 16 in the form of solder bumps are produced to be connected with the wirings 20 in a position to surround the resin layer 28.

In the forgoing manner, a semiconductor device 10D in accordance with the fourth embodiment of this invention has been produced.

Figure 10:
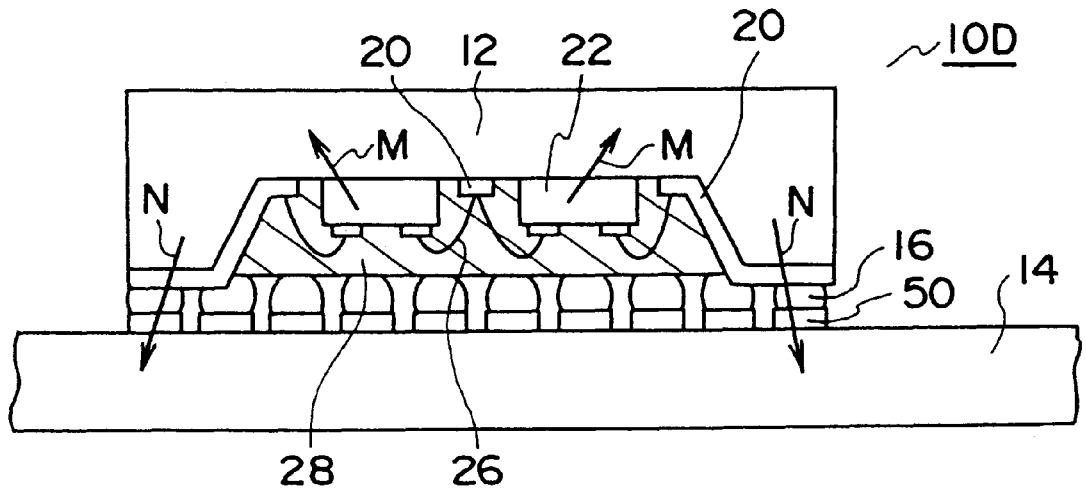
FIG. 10 is a cross section of a semiconductor device in accordance with the fourth embodiment of this invention, the semiconductor device being mounted on a mother board.

Referring to FIG. 10, the semiconductor device 10D is mounted on a larger printed circuit board or a mother board 14. When being mounted, the semiconductor device 10D is placed on the larger printed circuit board or the mother board 14 in a position in which each of electrodes 50 printed on the larger printed circuit board or a mother board 14 faces each of the solder bump electrodes 16. Thereafter, the semiconductor device is heated at a temperature range between 150° C. and 240° C. to melt the solder bump electrodes 16.

The advantages of the semiconductor device 10D in accordance with the fifth embodiment of this invention are itemized below.

1. Since the material of the square or rectangular plate 12 is identical or similar to that of the semiconductor pellets 22, a thermal stress can hardly occur between the plate 12 and the semiconductor pellets 22 during the period in which the semiconductor device 10D is mounted on a larger printed circuit board or a mother board 14, resultantly reducing possibility in which the interface between the plate 12 and the resin layer 28 breaks.
2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is put into practical operation.
3. Since the heat generated in the semiconductor device under practical services is dissipated into the larger printed circuit board or the mother board 14, passing through the plate 12 and the solder bumps 16 and the electrodes 50, as shown by arrows M and N respectively, a better grade can be realized for the heat dissipation efficiency.
4. Since arbitrary Si pellets 22 having any particular function can be selected, any particular function can be readily realized by a proper selection of the Si pellets 22.
5. It is noted that the length of the connection among the Si pellets 22 is remarkably shorter for the semiconductor device 10D in accordance with the fourth embodiment of this invention than for the one available in the prior art.

6. The foregoing advantages, in combination, remarkably improves the reliability of the semiconductor device 10D in accordance with the fourth embodiment of this invention, because there are less possibilities in which humidity contacts the metal parts of the semiconductor pellets 22 to cause corrosion and in which overheating of the semiconductor device is readily prevented from occurring to resultantly secure an improved operation speed for the semiconductor device. It is further noted that the semiconductor device in accordance with the fourth embodiment of this invention 10D is involved with a good grade of versatility in the function thereof, as was described above.

It is noted the number of the semiconductor pellets 22 to be mounted on one Si plate 12 is entirely free.

Fifth Embodiment

Figure 11:
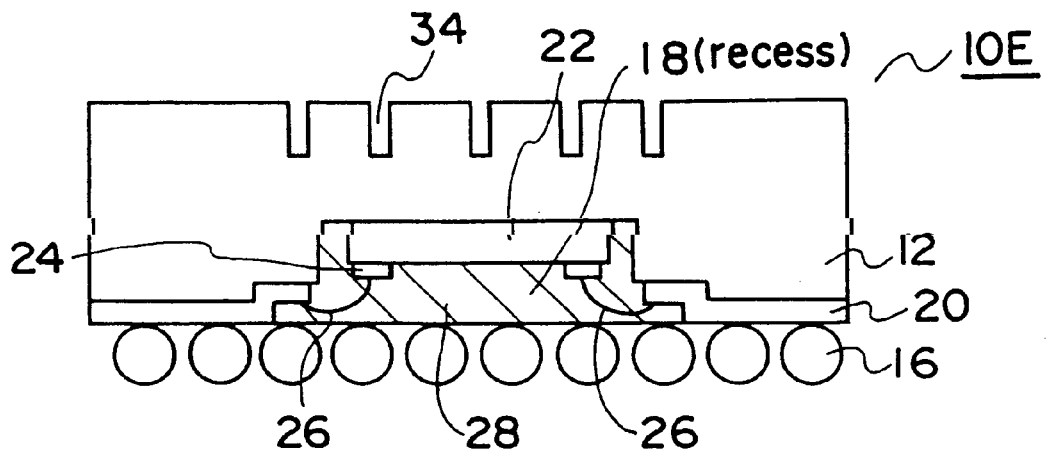
FIG. 11 is a cross section of a semiconductor device in accordance with the fifth embodiment of this invention.

Referring to FIG. 11, a chemical etching process or a laser etching process is conducted to produce a two stepped recess 18 having a small horizontal dimension surrounded by a shallow recess having a larger horizontal dimension along one surface of a square or rectangular plate 12 of e.g. Si. An etching process such as a mechanical etching process employing a blade, a chemical etching process or a laser etching process is conducted to produce plural grooves 34 arranged in parallel to one another or in an arbitrary arrangement including an arrangement in which the grooves cross to one another. After an Al layer is produced to cover step and the surface of the Si plate 12 surrounding the step, an etching process is conducted to remain patterned Al wirings 20 extending in a radial direction and having one end terminated at the edge of the shallow recess, as is illustrated in FIG. 11. In this example, the height of the first step or the depth of the shallow recess is supposed to vary between 30 $\mu$m and 100 $\mu$m, and the height of the second step or the depth of the deep recess is supposed to vary between 250 $\mu$m and 580 $\mu$m. The thickness of a semiconductor pellet 22 to be referred to below is supposed to vary 200 $\mu$m and 300 $\mu$m.

A pellet 22 made of a semiconductor e.g. Si in which at least one semiconductor device element has been produced and on which bonding pads 24 have been produced along the periphery thereof, is adhered along the surface of the recess 18 in a position in which the bonding pads do not face the surface of the recess 18. A wire bonding process is conducted to connect each of the bonding pads 24 with corresponding one of the wirings 20, employing bonding wires 26.

The recess 18 is buried with a resin. The object of the resin layer 28 is to protect and passivate the semiconductor pellet 22. The surface of the resin layer 28 is made flush with surface of the Si plate 12.

Plural electrodes 16 in the form of solder bumps are produced to be connected with the wirings 20 in a position to surround the resin layer 28.

In the forgoing manner, a semiconductor device 10E in accordance with the fifth embodiment of this invention has been produced.

Figure 12:
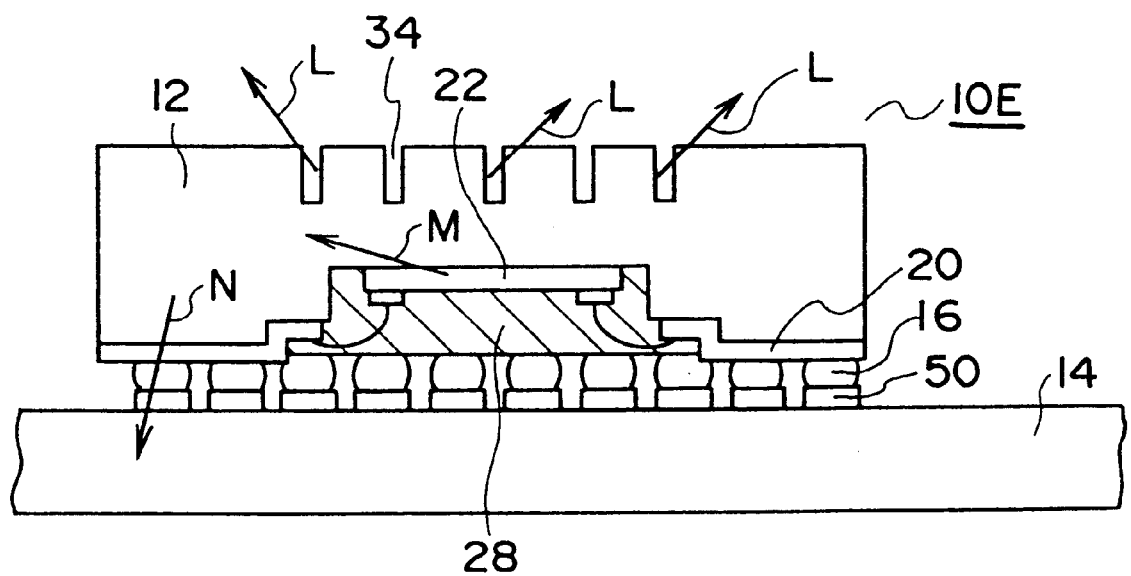
FIG. 12 is a cross section of a semiconductor device in accordance with the fifth embodiment of this invention, the semiconductor device being mounted on a mother board.

Referring to FIG. 12, the semiconductor device 10E in accordance with the fifth embodiment of this invention is mounted on a larger printed circuit board or a mother board 14. When being mounted, the semiconductor device 10E is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10E in accordance with the fifth embodiment of this invention are itemized below.

1. Since the material of the square or rectangular plate 12 is identical or similar to that of the semiconductor pellet 22, a thermal stress can hardly occur between the plate 12 and the semiconductor pellet 22 during the period in which the semiconductor device 10E is mounted on a larger printed circuit board or a mother board 14, resultantly reducing possibility in which the interface between the plate 12 and the resin layer 28 breaks.

2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a layer printed circuit board or a mother board 14 or during a process under which the semiconductor device is put into practical operation.

3. Since the heat generated in the semiconductor device under practical services is dissipated into the larger printed circuit board or the mother board 14, passing through the plate 12 and the solder bumps 16 and the electrodes 50, as shown by arrows M and N respectively, and since the heat generated in the semiconductor device under practical services is dissipated into the air through the surface of the grooves 34, as shown by an arrow L, a better grade can be realized for the heat dissipation efficiency.

4. Since the recess 18 of the Si plate 12 is a stepped one having a shallow shoulder in addition to a deep bottom, additional advantages are recognized as follows.

A. The process for producing the wirings 20 becomes easier, because the magnitude of the step is less. There is a less possibility in which the wirings 20 are discontinued at an edge of the step.

B. The possibility in which a bonding wire 26 contacts the edge of the semiconductor pellet 22, becomes less, because the level of the bonding pad 24 is nearly identical to that of the wiring 20 on the step.

5. Since the Si plate 12 has plural grooves on the top surface thereof allowing it to have a larger surface area, a larger grade of heat dissipation efficiency can be realized.

6. The foregoing advantages, in combination, remarkably improves the reliability of the semiconductor device 10E in accordance with the fifth embodiment of this invention, because there are less possibilities in which the wirings 20 discontinue and/or the bonding wires are short-circuited with the edge of the semiconductor pellet 22, in addition to a less magnitude of the possibility in which humidity contacts the metal parts of the semiconductor pellet 22 to cause corrosion and in which overheating of the semiconductor device is readily prevented from occurring to resultantly secure an improved operation speed for the semiconductor device.

Sixth Embodiment

Figure 13:
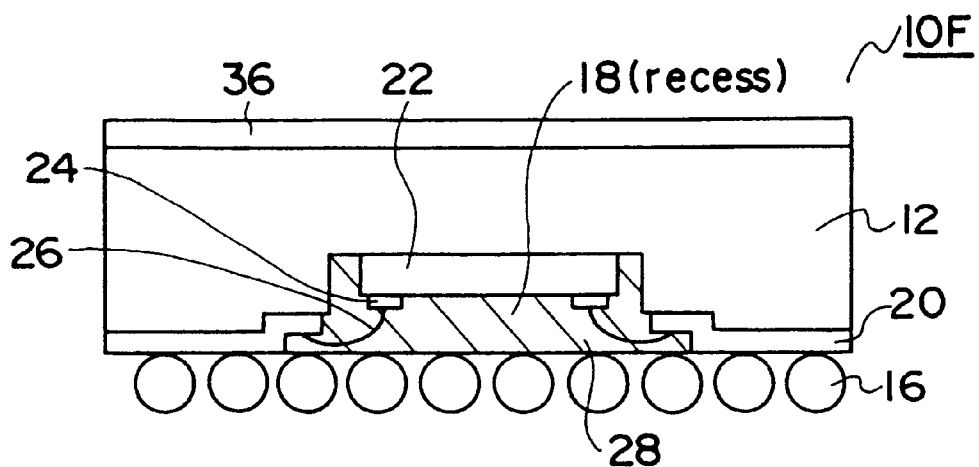
FIG. 13 is a cross section of a semiconductor device in accordance with the sixth embodiment of this invention.

Referring to FIG. 13, a chemical etching process or a laser etching process is conducted to produce a multi-stepped recess 18 (In the drawing, a two stepped recess) having a deep recess having a small horizontal dimension and being surrounded by a shallow recess having a large horizontal dimension along one surface of a square or rectangular plate 12 of Si. A vacuum evaporation process et al. is conducted to produce a metal layer 36 made of Au et al. along the opposite surface of the Si plate 12. After an Al layer is produced to cover the surface of the step and the surface of the Si plate 12 surrounding the step, an etching process is conducted to remain patterned Al wirings 20 extending in a radial direction and having one end terminated at the edge of the shallow recess, as is illustrated in FIG. 13. In this example, the height of the first step or the depth of the shallow recess is supposed to vary between 30 μm and 100 μm, and the height of the second step or the depth of the deep recess is supposed to vary between 250 μm and 580 μm. The thickness of a semiconductor pellet 22 to be referred to below is supposed to vary 200 μm and 300 μm.

A pellet 22 made of a semiconductor e.g. Si in which at least one semiconductor device element has been produced and on which bonding pads 24 have been produced along the periphery thereof, is adhered along the surface of the recess 18 in a position in which the bonding pads do not face the surface of the recess 18. A wire bonding process is conducted to connect each of the bonding pads 24 with corresponding one of the wirings 20, employing bonding wires 26.

The recess 18 is buried with a resin. The object of the resin layer 28 is to protect and passivate the semiconductor pellet 22.

Plural electrodes 16 in the form of solder bumps are produced to be connected with the wirings 20 in a position to surround the resin layer 28.

In the forgoing manner, a semiconductor device 10F in accordance with the sixth embodiment of this invention has been produced.

Figure 14:
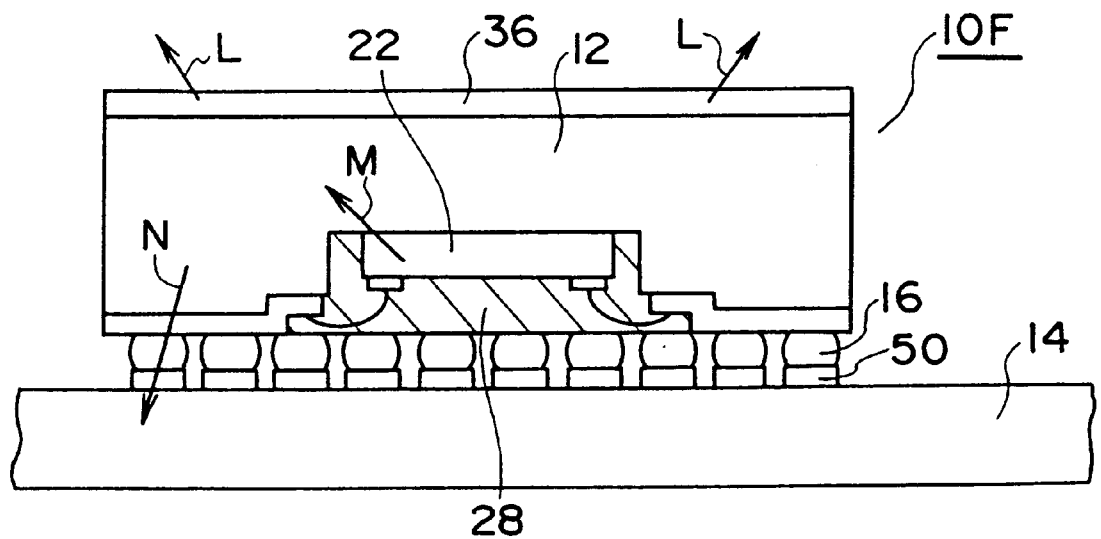
FIG. 14 is a cross section of a semiconductor device in accordance with the sixth embodiment of this invention, the semiconductor device being mounted on a mother board.

Referring to FIG. 14, the semiconductor device 10F in accordance with the sixth embodiment of this invention is mounted on a larger printed circuit board or a mother board 14. When being mounted, the semiconductor device 10F is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10F in accordance with the fifth embodiment of this invention are itemized below.
1. Since the material of the square or rectangular plate 12 is identical or similar to that of the semiconductor pellet 22, a thermal stress can hardly occur between the plate 12 and the semiconductor pellet 22 during the period in which the semiconductor device 10E is mounted on a larger printed circuit board or a mother board 14, resultantly reducing possibility in which the interface between the plate 12 and the resin layer 28 breaks.
2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is put into practical operation.
3. Since the heat generated in the semiconductor device under practical services is dissipated into the larger printed circuit board or the mother board 14, passing through the plate 12 and the solder bumps 16 and the electrodes 50, as shown by arrows M and N respectively, a better grade can be realized for the heat dissipation efficiency. In addition, since a metal layer 36 made of Au et al. is arranged on the top surface of the Si plate 12, the heat generated in the semiconductor device under practical services is dissipated into the air, as shown in an arrow L, resultantly improving the heat dissipation efficiency.
4. Since the recess 18 of the Si plate 12 is a stepped one having a shallow shoulder in addition to a deep bottom, additional advantages are recognized as follows.
A. The process for producing the wirings 20 becomes easier, because the magnitude of the step is less. There is a less possibility in which the wirings 20 are discontinued at an edge of the step.
B. The possibility in which a bonding wire 26 contacts the edge of the semiconductor pellet 22, becomes less, because the level of the bonding pad 24 is nearly identical to that of the wiring 20 on the step.
5. The foregoing advantages, in combination, remarkably improves the reliability of the semiconductor device 10F in accordance with the sixth embodiment of this invention, because there are less possibilities in which the wirings 20 discontinue and/or the bonding wires are short-circuited with the edge of the semiconductor pellet 22, in addition to a less magnitude of the possibility in which humidity contacts the metal parts of the semiconductor pellet 22 to cause corrosion and in which overheating of the semiconductor device is readily prevented from occurring to resultantly secure an improved operation speed for the semiconductor device. In addition, it is noted that the length of time required for producing the semiconductor device is less.

Seventh Embodiment

Figure 15:
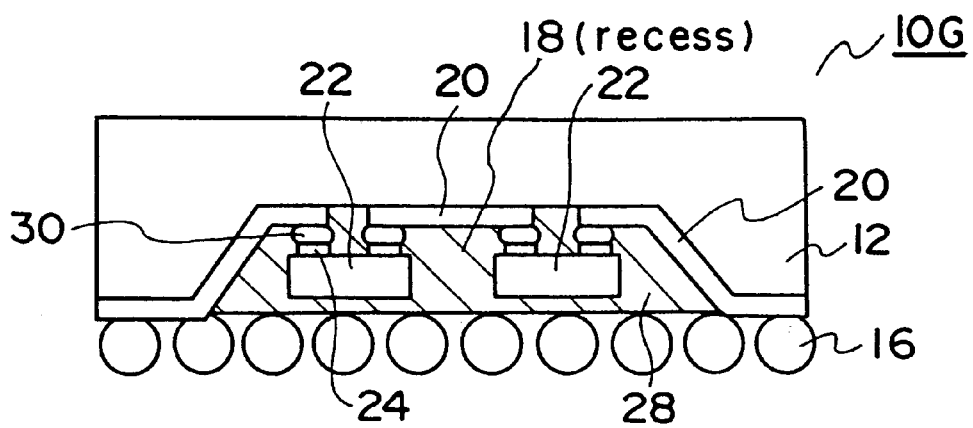
FIG. 15 is a cross section of a semiconductor device in accordance with the seventh embodiment of this invention.

Referring to FIG. 15, a chemical etching process or a laser etching process is conducted to produce a multi-stepped recess 18 along one surface of a square or rectangular plate 12 of e.g. Si. After an Al layer is produced to cover the surface of the recess 18 and the surface of the Si plate 12 surrounding the recess 18, an etching process is conducted to remain patterned Al wirings 20 extending to the neighborhood of bonding pads 24 of Si pellets 22 which are scheduled to be arranged in the recess 18.

Two or more pellets 22 made of a semiconductor e.g. Si in each of which at least one semiconductor device element has been produced and on each of which bonding pads 24 have been produced along the periphery thereof, are adhered along the surface of the recess 18 in a position in which the bonding pads face the surface of the recess 18. The number of the Si pellets 22 and the horizontal arrangement of the Si pellets 22 in the recess 18 are entirely free. Solder bump electrodes 30 are employed to connect each of bonding pads 24 with corresponding one of the wirings 2. The horizontal shape of the Al wirings 20 is selected to be compatible with the horizontal arrangement of the Si pellets 22 in the recess 18, in a manner to make the length of the Al wirings 20 minimum.

The recess 18 is buried with a resin. The object of the resin layer 28 is to protect and passivate the Si pellets 22.

Plural electrodes 16 in the form of solder bumps are produced to be connected with the wirings 20 in a position to surround the resin layer 28.

In the forgoing manner, a semiconductor device 10G in accordance with the seventh embodiment of this invention has been produced.

Figure 16:
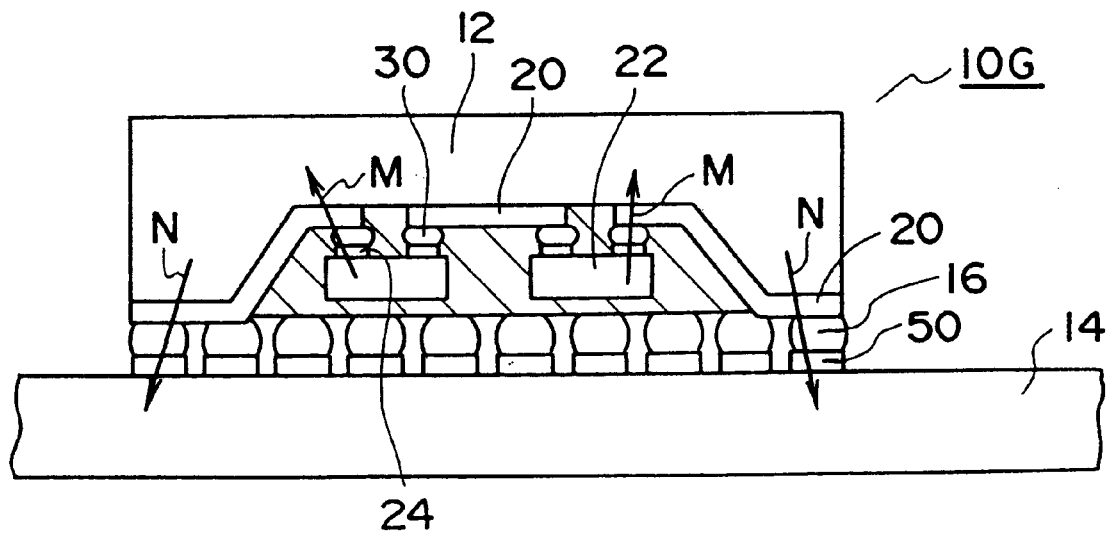
FIG. 16 is a cross section of a semiconductor device in accordance h the seventh embodiment of this invention, the semiconductor device being mounted on a mother board.

Referring to FIG. 16, the semiconductor device 10G in accordance with the seventh embodiment of this invention is mounted on a larger printed circuit board or a mother board 14. When being mounted, the semiconductor device 10G is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10G in accordance with the seventh embodiment of this invention are itemized below.

1. Since the material of the square or rectangular plate 12 is identical or similar to that of the semiconductor pellets 22, a thermal stress can hardly occur between the plate 12 and the semiconductor pellets 22 during the period in which the semiconductor device 10G is mounted on a larger printed circuit board or a mother board 14, resultantly reducing possibility in which the interface between the plate 12 and the resin layer 28 breaks.
2. Since the resin layer 28 is a bulk of a resin which was hardened and inflated in a recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is in practical operation.
3. Since the heat generated in the semiconductor device under practical services is dissipated into the larger printed circuit board or the mother board 14, passing through the plate 12 and the solder bumps 16 and the electrodes 50, as shown by arrows M and N respectively, a better grade can be realized for the heat dissipation efficiency.
4. Since arbitrary Si pellets 22 having any particular function can be selected, any particular function can be realized by a proper selection of the Si pellets 22.
5. It is noted that the length of the connection among the Si pellets 22 is remarkably shorter for the semiconductor device 10G in accordance with the seventh embodiment of this invention than for the one available in the prior art.
6. Since the semiconductor pellets 22 are mounted on the surface of the recess 18 in a face down position, and since the bonding pads 24 of the semiconductor pellets 22 are connected with the wirings 20 arranged along the surface of the recess 18 by solder bumps 30, a less length of time is required for producing the semiconductor device 10G and a larger heat dissipation efficiency is realized for the semiconductor device 10G.
7. The foregoing advantages, in combination, remarkably improves the reliability of the semiconductor device 10G in accordance with the seventh embodiment of this invention, because there are less possibilities in which humidity contacts the metal parts of the semiconductor pellets 22 to cause corrosion and in which overheating of the semiconductor device is readily prevented from occurring to resultantly secure an improved operation speed for the semiconductor device. In addition, it is noted that the length of time required for producing the semiconductor device is less.

Eighth Embodiment

Figure 17:
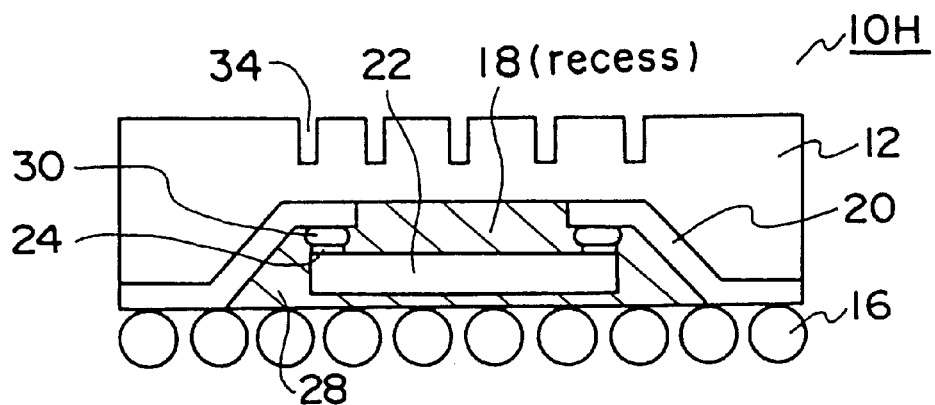
FIG. 17 is a cross section of a semiconductor device in accordance with the eighth embodiment of this invention.

Referring to FIG. 17, a chemical etching process or a laser etching process is conducted to produce a recess 18 along one surface of a square or rectangular plate 12 of e.g. Si. An etching process such as a mechanical etching process employing a blade, a chemical etching process or a laser etching process is conducted to produce plural grooves 34 arranged in parallel to one another or in an arbitrary arrangement including an arrangement in which the grooves cross to one another. After an Al layer is produced to cover the surface of the recess 18 and the surface of the Si plate 12 surrounding the recess 18, an etching process is conducted to remain patterned Al wirings 20 extending in a radial direction.

A pellet 22 made of a semiconductor e.g. Si in which at least one semiconductor device element has been produced and on which bonding pads 24 have been produced along the periphery thereof, is adhered along the surface of the recess 18 in a position in which the bonding pads face the surface of the recess 18. Solder bump electrodes 30 are employed to connect each of the bonding pads 24 with corresponding one of the wirings 26.

The recess 18 is buried with a resin. The object of the resin layer 28 is to protect and passivate the semiconductor pellet 22.

Plural electrodes 16 in the form of solder bumps are produced to be connected with the wirings 20 in a position to surround the resin layer 28.

In the forgoing manner, a semiconductor device 10H in accordance with the eighth embodiment of this invention has been produced.

Figure 18:
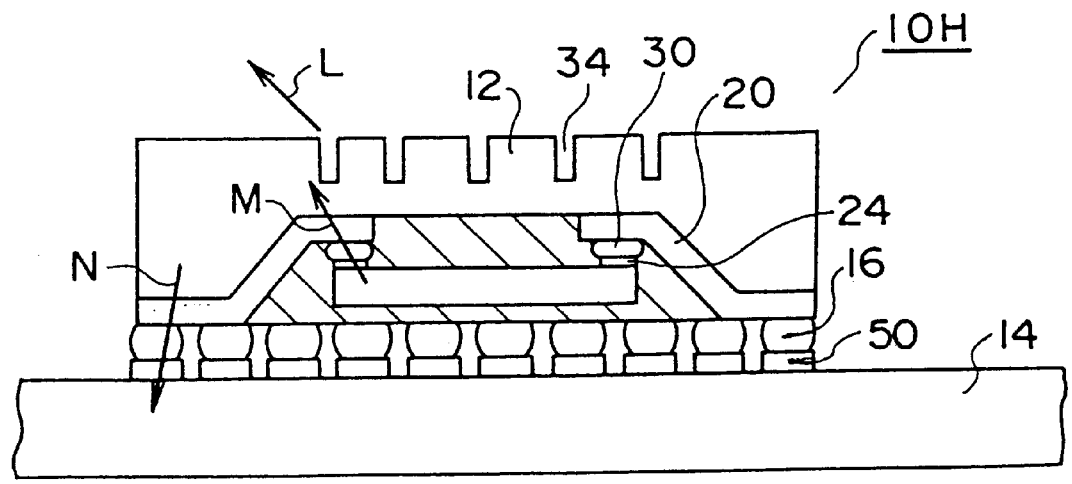
FIG. 18 is a cross section of a semiconductor device in accordance with the eighth embodiment of this invention, the semiconductor device being mounted on a mother board.
Figure 19:
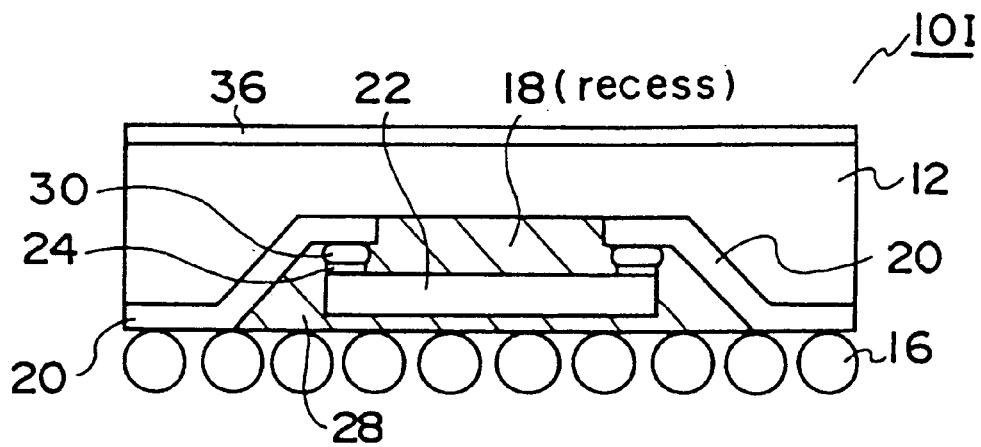
FIG. 19 is a cross section of a semiconductor device in accordance with the ninth embodiment of this invention.

Referring to FIG. 18, the semiconductor device 10H in accordance with the eighth embodiment of this invention is mounted on a larger printed circuit board or a mother board 14. When being mounted, the semiconductor device 10H is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10H in accordance with the eighth embodiment of this invention are itemized below.

1. Since the material of the square or rectangular plate 12 is identical or similar to that of the semiconductor pellet 22, a thermal stress can hardly occur between the plate 12 and the semiconductor pellet 22 during the period in which the semiconductor device 10H is mounted on a larger printed circuit board or a mother board 14, resultantly reducing possibility in which the interface between the plate 12 and the resin layer 28 breaks.
2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is in practical operation.
3. Since the heat generated in the semiconductor device under practical services is dissipated into the larger printed circuit board or the mother board 14, passing through the plate 12 and the solder bumps 16 and the electrodes 50, as shown by arrows L, M and N respectively, a better grade can be realized for the heat dissipation efficiency.
4. Since the semiconductor pellet 22 is mounted on the surface of the recess 18 in a face down position, and since the solder bumps 30 are employed for connecting the bonding pads 24 and the wirings 20, a less length of time is required for producing the semiconductor device 10H and a larger heat dissipation efficiency is realized for the semiconductor device 10H.

5. Since the Si plate 12 has plural grooves on the top surface thereof allowing it to have a larger surface area, a larger grade of heat dissipation efficiency can be realized.

6. The foregoing advantages, in combination, remarkably improves the reliability of the semiconductor device 10H in accordance with the eighth embodiment of this invention, because there are less possibilities in which the wirings 20 discontinue and/or the bonding wires are short-circuited with the edge of the semiconductor pellet 22, in addition to a less magnitude of the possibility in which humidity contacts the metal parts of the semiconductor pellet 22 to cause corrosion and in which overheating of the semiconductor device is readily prevented from occurring to resultantly secure an improved operation speed for the semiconductor device.

Ninth Embodiment

Referring to FIG. 9, a chemical etching process or a laser etching process is conducted to produce a recess 18 along one surface of a square or rectangular plate 12 of e.g. Si. A vacuum evaporation process et al. is conducted to produce a metal layer 36 along the surface of the Si plate 12 opposite to the surface along which the recess 18 was produced. After an Al layer is produced to cover the surface of the recess 18 and the surface of the Si plate 12 surrounding the recess 18, an etching process is conducted to remain patterned Al wirings 20 extending in a radial direction.

A pellet 22 made of a semiconductor e.g. Si in which at least one semiconductor device element has been produced and on which bonding pads 24 have been produced along the periphery thereof, is adhered along the surface of the recess 18 in a position in which the bonding pads face the surface of the recess 18. Solder bump electrodes 30 are employed to connect each of the bonding pads 24 with corresponding one of the wirings 20.

The recess 18 is buried with a resin. The object of the resin layer 28 is to protect and passivate the semiconductor pellet 22.

Plural electrodes 16 in the form of solder bumps are produced to be connected with the wirings 20 in a position to surround the resin layer 28.

In the forgoing manner, a semiconductor device 101 in accordance with the ninth embodiment of this invention has been produced.

Figure 20:
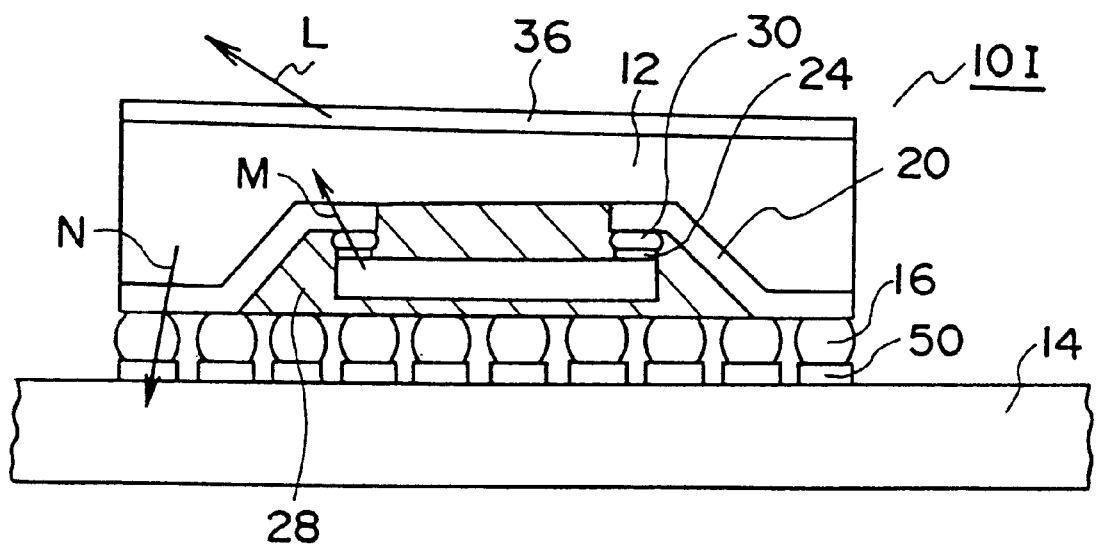
FIG. 20 is a cross section of a semiconductor device in accordance with the ninth embodiment of this invention, the semiconductor device being mounted on a mother board.

Referring to FIG. 20, the semiconductor device 101 in accordance with the ninth embodiment of this invention is mounted on a larger printed circuit board or the mother board 14. When being mounted, the semiconductor device 101 is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 101 in accordance with the ninth embodiment of this invention are itemized below.

1. Since the material of the square or rectangular plate 12 is identical or similar to that of the semiconductor pellet 22, a thermal stress can hardly occur between the plate 12 and the semiconductor pellet 22 during the period in which the semiconductor device 101 is mounted on a larger printed circuit board or a mother board 14, resultantly reducing possibility in which the interface between the plate 12 and the resin layer 28 breaks.

2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is in practical operation.

3. Since the heat generated in the semiconductor device under practical services is dissipated into the air through the metal layer 36 as shown by an arrow L, in addition to the passage passing through the plate 12 and the solder bumps 16 and the electrodes 50, as shown by arrows M and N respectively, a better grade can be realized for the heat dissipation efficiency.

4. Since the semiconductor pellet 22 is mounted on the surface of the recess 18 in a face down position, and since the bonding pads 24 of the semiconductor pellet 22 are connected with the wirings 20 arranged along the surface of the recess 18 by solder bumps 30, a less length of time is required for producing the semiconductor device 101 and a larger heat dissipation efficiency is realized for the semiconductor device 101.

5. The foregoing advantages, in combination, remarkably improves the reliability of the semiconductor device 101 in accordance with the ninth embodiment of this invention, because there are less possibilities in which humidity contacts the metal parts of the semiconductor pellet 22 to cause corrosion and in which overheating of the semiconductor device is readily prevented from occurring to resultantly secure an improved operation speed for the semiconductor device. In addition, it is noted that the length of time required for producing the semiconductor device is less.

Tenth Embodiment

Figure 21:
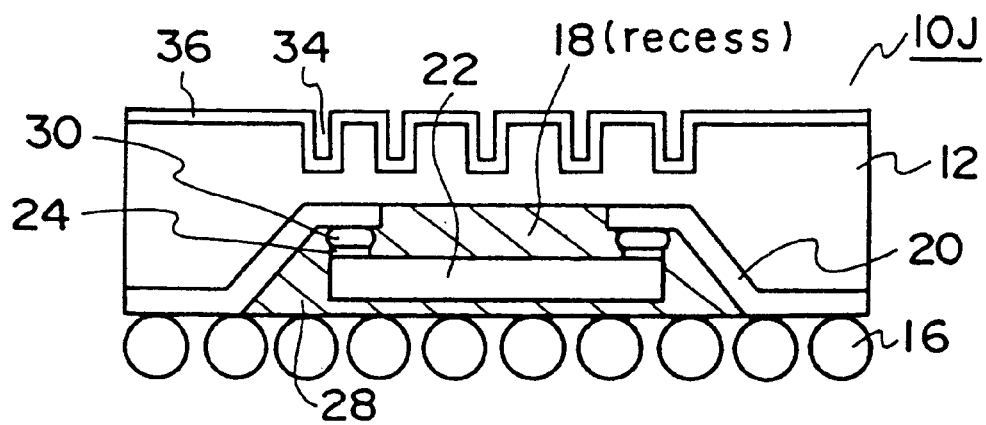
FIG. 21 is a cross section of a semiconductor device in accordance with the tenth embodiment of this invention.

Referring to FIG. 21, a chemical etching process or a laser etching process is conducted to produce a recess 18 along one surface of a square or rectangular plate 12 of e.g. Si. An etching process such as a mechanical etching process employing a blade, a chemical etching process or a laser etching process is conducted to produce plural grooves 34 arranged in parallel to one another or in an arbitrary arrangement including an arrangement in which the grooves cross to one another. A vacuum evaporation process et al. is conducted to produce a metal layer 36 along the surface of the Si plate 12 along which the plural grooves 34 were produced. After an Al layer is produced to cover the surface of the recess 18 and the surface of the Si plate 12 surrounding the recess 18, an etching process is conducted to remain patterned Al wirings 20 extending in a radial direction.

A pellet 22 made of a semiconductor e.g. Si in which at least one semiconductor device element has been produced and on which bonding pads 24 have been produced along the periphery thereof, is adhered along the surface of the recess 18 in a position in which the bonding pads face the surface of the recess 18. Solder bump electrodes 30 are employed to connect each of the bonding pads 24 with corresponding one of the wirings 20.

The recess 18 is buried with a resin. The object of the resin layer 28 is to protect and passivate the semiconductor pellet 22.

Plural electrodes 16 in the form of solder bumps are produced to be connected with the wirings 20 in a position to surround the resin layer 28.

In the forgoing manner, a semiconductor device 10J in accordance with the tenth embodiment of this invention has been produced.

Figure 22:
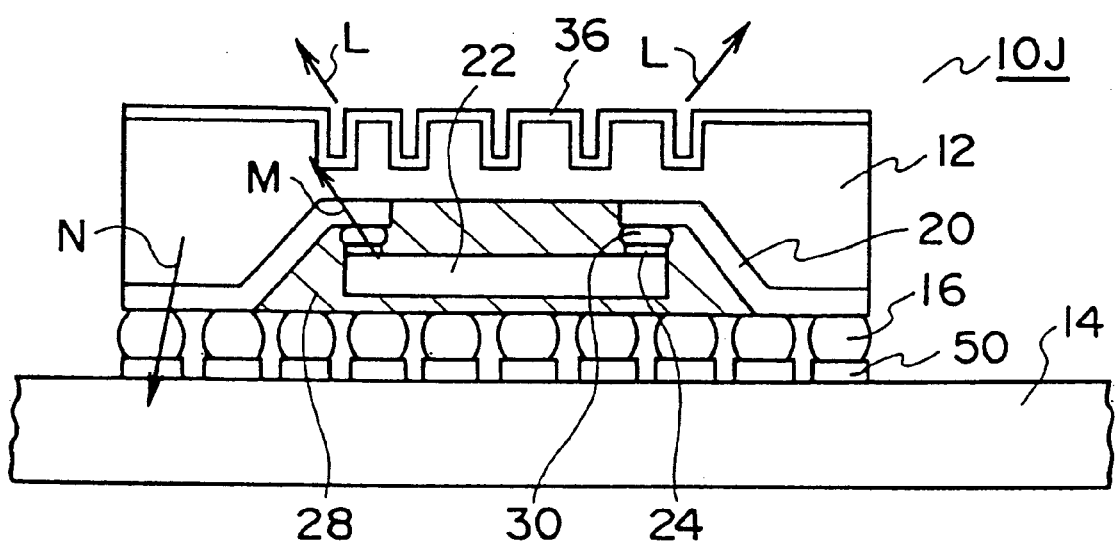
FIG. 22 is a cross section of a semiconductor device in accordance with the tenth embodiment of this invention, the semiconductor device being mounted on a mother board.

Referring to FIG. 22, the semiconductor device 10J in accordance with the tenth embodiment of this invention is mounted on a larger printed circuit board or the mother board 14. When being mounted, the semiconductor device 10J is placed on the larger printed circuit board or the mother board 14 in a position in which each of electrodes 50 printed on the larger printed circuit board or the mother board 14 faces each of the solder bump electrodes 16. Thereafter, the semiconductor device is heated at a temperature range between 150° C. and 240° C. to melt the solder bump electrodes 16.

The advantages of the semiconductor device 10J in accordance with the tenth embodiment of this invention are itemized below.

1. Since the material of the square or rectangular plate 12 is identical or similar to that of the semiconductor pellet 22, a thermal stress can hardly occur between the plate 12 and the semiconductor pellet 22 during the period in which the semiconductor device 10J is mounted on a larger printed circuit board or a mother board 14, resultantly reducing possibility in which the interface between the plate 12 and the resin layer 28 breaks.
2. Since the resin layer 28 is a bulk of a resin which was hardened and inflated in the recess 18, the resin layer 28 is under a mechanical stress under which the resin layer 28 is inclined to expand. As a result, the interface between the plate 12 and the resin layer 28 can hardly break, when being imposed thermal cycling, during a process for mounting the semiconductor device on a larger printed circuit board or a mother board 14 or during a process under which the semiconductor device is in practical operation.
3. Since the heat generated in the semiconductor device under practical services is dissipated into the air through the metal layer 36 as shown by an arrow L, in addition to the passage passing through the plate 12 and the solder bumps 16 and the electrodes 50, as shown by arrows M and N respectively, a better grade can be realized for the heat dissipation efficiency.
4. Since the semiconductor pellet 22 is mounted on the surface of the recess 18 in a face down position, and since the recess 18 by solder bumps 30, a less length of time is required for producing the semiconductor device 10J and a larger heat dissipation efficiency is realized for the semiconductor device 10J.
5. The foregoing advantages, in combination, remarkably improves the reliability of the semiconductor device 10J in accordance with the tenth embodiment of this invention, because there are less possibilities in which humidity contacts the metal parts of the semiconductor pellet 22 to cause corrosion and in which overheating of the semiconductor device is readily prevented from occurring to resultantly secure an improved operation speed for the semiconductor device. In addition, it is noted that the length of time required for producing the semiconductor device is less.

The foregoing description has clarified that the present invention has successfully provided a variety of semiconductor devices for which the hermetic seal is reliable for the interface between one or more semiconductor pellets arranged therein and a resin layer which covers the semiconductor pellet or pellets, resultantly effectively preventing humidity from contacting the metal parts of the circuits of the semiconductor device and protecting the metal parts of the circuits from potential corrosion and for which the thermal conductivity has been improved, resultantly preventing a delay in operation speed from occurring due to a temperature rise thereof, and a method for producing the variety of semiconductor devices presented above.

Various modifications of the disclosed embodiments as well as other embodiments of this invention, will be apparent to persons skilled in the art upon to the description of this invention. It is therefore contemplated that the appended claims will cover any such modifications or embodiments as fall within the true scope of this invention.

What is claimed is:

1. The semiconductor device comprising:
    a semiconductor pellet made of a semiconductor material and having bonding pads;
    a plate having a first surface and a second surface opposite to the first surface, the plate being made of the semiconductor material and having a recess formed on the first surface, and the semiconductor pellet being mounted on the recess;
    wirings formed on the first surface of the plate, the wirings extending from the recess to the first surface of the plate to be coupled with the bonding pads of the semiconductor pellet;
    a resin sealing the semiconductor pellet and a portion of the wirings;
    a plurality of electrodes formed on the first surface and coupled with the wirings respectively, wherein a surface of the semiconductor pellet on which the bonding pads are formed faces a bottom of the recess;
    another semiconductor pellet made of a semiconductor material and having bonding pads, the another semiconductor pellet being mounted on a bottom of the same recess as said semiconductor pellet is mounted therein; and
    further wirings formed on the first surface of the plate, the further wirings extending from the recess to the first surface of the plate to be coupled with the bonding pads of the another semiconductor pellet.

2. The semiconductor device in accordance with claim 1, further comprising solder bump electrodes connecting the bonding pads of the semiconductor pellet with the wirings.

3. The semiconductor device in accordance with claim 2, wherein a surface of the semiconductor pellet on which the bonding pads are formed is spaced away from a bottom of the recess.

4. The semiconductor device in accordance with claim 1, wherein the recess is formed with multiple steps.

5. The semiconductor device in accordance with claim 1, wherein the wirings extend from a bottom of the recess to the first surface of the plate.

6. The semiconductor device in accordance with claim 1, wherein the second surface of the plate has a groove formed thereon.

7. The semiconductor device in accordance with claim 1, further comprising a metal layer formed on the second surface of the plate.

8. The semiconductor device in accordance with claim 1, wherein the semiconductor material of said semiconductor pellet and of said plate comprises silicon.

9. The semiconductor device in accordance with claim 1, wherein said semiconductor pellet and said plate each have the same coefficient of thermal expansion.

10. The semiconductor device in accordance with claim 1, further comprising additional wirings that electrically connect the semiconductor pellet and the another semiconductor pellet.

* * * * *